United States Patent [19]

Takahashi et al.

[11] Patent Number: 5,095,494
[45] Date of Patent: Mar. 10, 1992

[54] DATA TRANSMISSION APPARATUS
[75] Inventors: Chusei Takahashi; Hiroshi Etoh, both of Tokyo, Japan
[73] Assignee: Oki Electric Industry Co., Ltd., Japan
[21] Appl. No.: 355,433
[22] Filed: May 22, 1989
[30] Foreign Application Priority Data
  May 27, 1988 [JP] Japan .................. 1-128260
[51] Int. Cl.⁵ .............................. H04B 3/46
[52] U.S. Cl. ...................... 375/10; 375/121; 379/97; 371/5.5; 371/30
[58] Field of Search .............. 375/8, 10, 121; 379/97; 178/2 R; 371/3, 5.5, 30, 72; 340/825.06

[56] References Cited
U.S. PATENT DOCUMENTS 3,113,176 12/1963 Doktor et al. ................. 378/3
3,457,550 7/1969 Gibson et al. ................. 371/72
4,894,847 1/1990 Tjahjadi et al. ............... 375/121
4,905,282 2/1990 McGlynn et al. ............... 375/8
4,959,847 9/1990 Engelke et al. ................ 375/121

Primary Examiner—Benedict V. Safourek
Assistant Examiner—Young Tse
Attorney, Agent, or Firm—Edward D. Manzo

[57] ABSTRACT

A data transmission apparatus is capable of data transmissions with and/or without error control. A remote data transmission apparatus with error control recognizes whether or not the carrier sent from the data transmission apparatus is intermittent. Additionally, the data transmission apparatus recognizes, based upon the existence of interruptions of a carrier signal sent from a remote data transmission apparatus, whether or not the remote data transmission apparatus has an error control function.

9 Claims, 2 Drawing Sheets

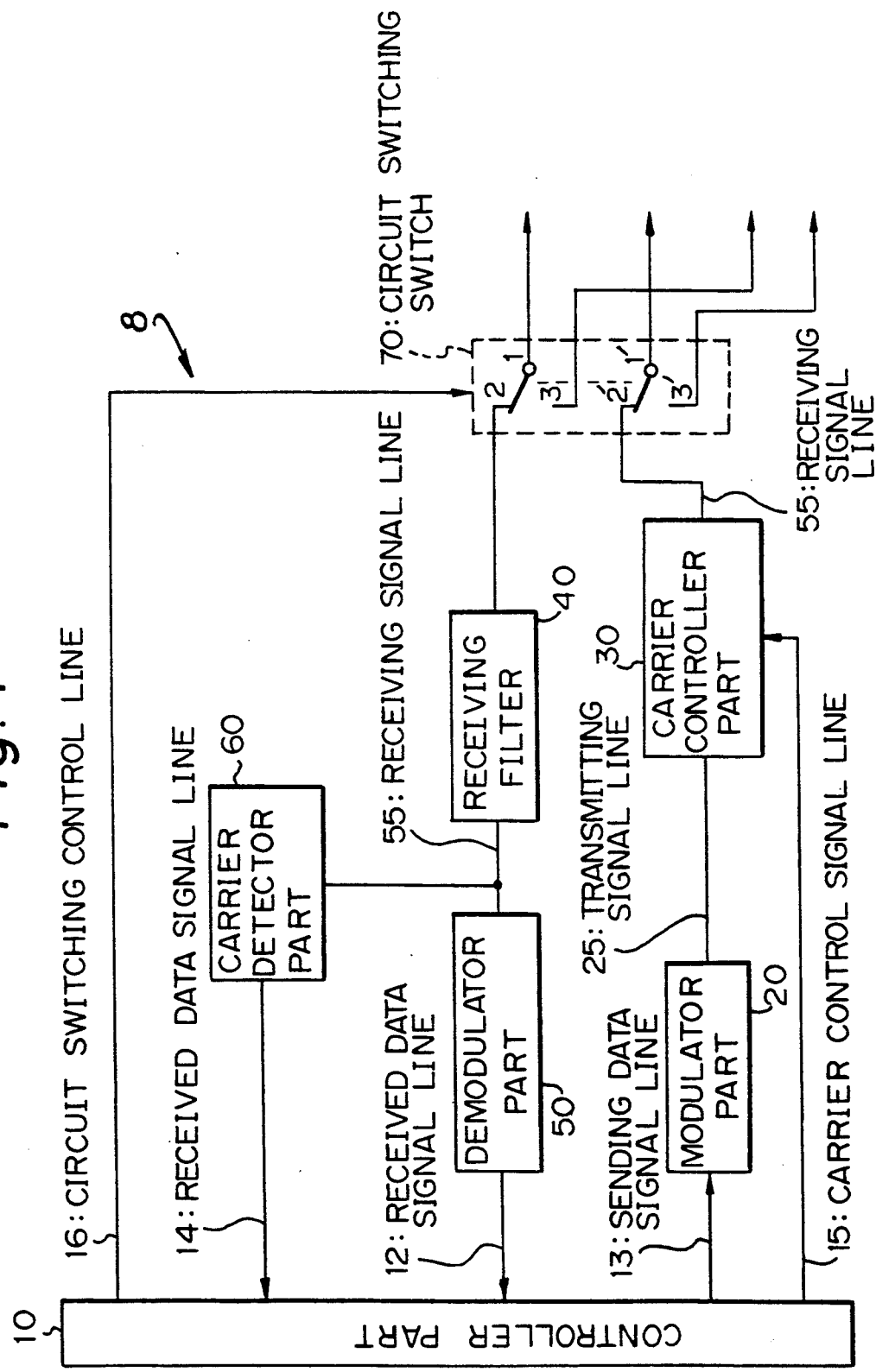

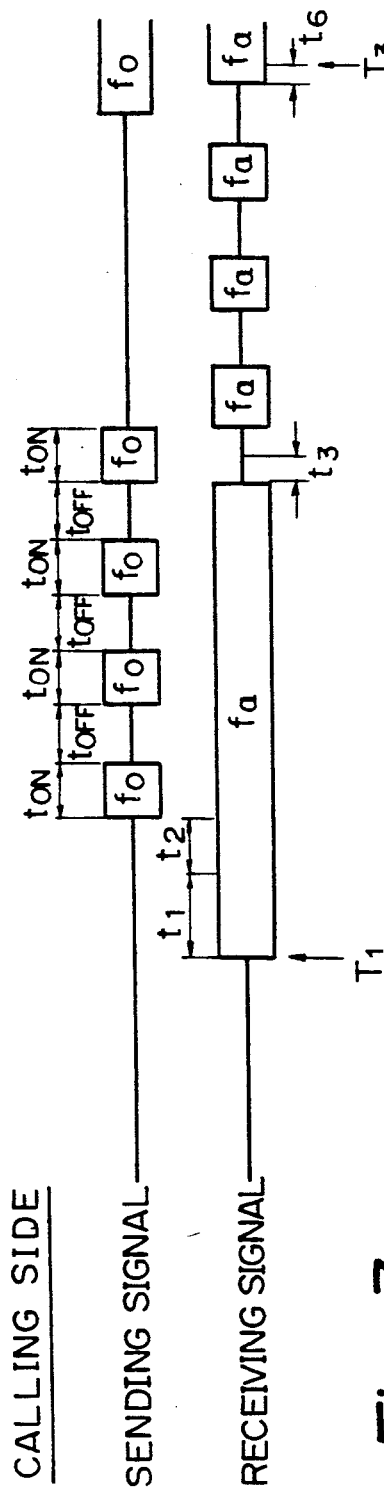
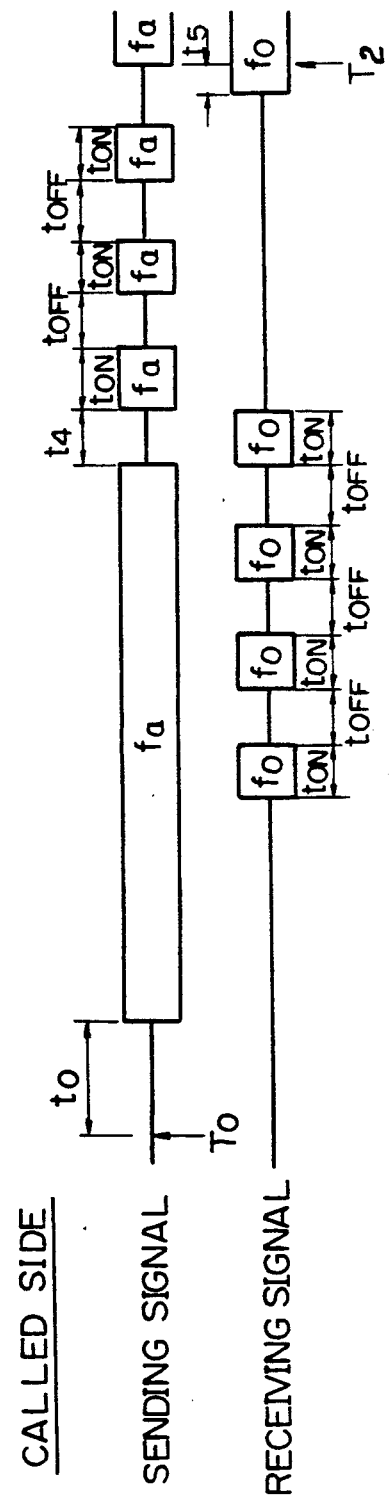
Fig. 2 CALLING SIDE
Fig. 3 CALLED SIDE

DATA TRANSMISSION APPARATUS

BACKGROUND OF THE INVENTION

1. Field of the Invention

The present invention relates to a data transmission apparatus capable of data transmissions with and/or without error control and more specifically to automatic recognition of whether or not a remote data transmission apparatus has an error control function.

2. Description of the Prior Art

In data transmission using an ordinary telephone network, the probability of mistaking data is very low, thereby allowing minimal error detection. Hence a data transmission apparatus is sufficient to modulate and demodulate only. In contrast, mobile data transmission using a mobile telephone and the like which often undergoes data error due to fading, etc., requires a very high performance error control system. Such data transmission apparatus is thus in need of a highly accurate error control function in addition to the modulation and demodulation function described above. Data transmission is therefore made impossible between a data transmission unit which effects mobile transmission using a mobile telephone, etc., and one which effects data transmission using an ordinary telephone network, requiring separate channel equipment.

To solve the difficulty, a data transmission apparatus has hitherto been proposed which can automatically recognize whether a remote data transmission apparatus is for mobile data transmission or a data transmission modem directed to an ordinary telephone network.

A conventional apparatus of the type described above selects between a mobile data transmission modulator/demodulator unit and an ordinary telephone network modulator/demodulator unit on the basis of carrier frequencies of incoming input signals after demodulation detected by a carrier detector part. Among the carrier frequencies, one is for mobile data transmission (mobile telephone channel) where data transmission is effected utilizing error control, and another is for ordinary telephone network data transmission where data transmission is effected without error control. These carrier frequencies are different from each other so as to be discriminated.

In view of the drawbacks of the conventional data transmission apparatus, it is an object of the present invention to provide a data transmission apparatus and method capable of both data transmissions each with and/or without error control.

SUMMARY OF THE INVENTION

To achieve the above object, a data transmission method using the present invention involves transmitting interrupted carrier waves to indicate that the transmitting side ("calling side") is equipped with error control. These interruptions occur prior to transmitting data to the called side. Each side will detect the presence or absence of interruptions and thereafter operate accordingly. That is to say, if the calling side has error control, it sends an interrupted carrier. If the called side also has error control, it will recognize the interrupted carrier and respond with an interrupted carrier of its own. The calling side will examine the answering carrier, since interruptions therein indicate error control, but an uninterrupted signal means no error control is present in the remote, called side. Further, according to a method aspect of the invention, if the calling side has no error control, then it does not interrupt its carrier. The called side may nevertheless send an interrupted carrier to establish whether the calling side has error control, but the calling side will not recognize this signal and therefore not acknowledge it with a reciprocal interrupted carrier.

According to structure aspects of the invention, a data transmission circuit or apparatus comprises (a) a transmitter for sending an intermittent carrier signal before the apparatus transmits any data with use of error control. It further comprises (b) a carrier detector for detecting whether a received carrier signal (sent from a remote data transmission apparatus) is intermittent or not, and (c) a control device or circuit for controlling the transmitter while recognizing whether the remote data transmission apparatus has an error control function based upon the result of detection by the detector.

The foregoing and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 1 is a block diagram illustrating a portion of a data transmission apparatus of an embodiment according to the present invention; and FIGS. 2 and 3 are timing charts each illustrating an automatic recognition procedure of the embodiment of FIG. 1.

DESCRIPTION OF THE PREFERRED EMBODIMENT

For ease of description, a local unit will have components referenced by numerals without asterisks, and a remote unit will be referred to with numerals followed by an asterisk. The local unit may comprise the calling side at one time or the called side at another.

Referring now to FIG. 1, a portion 8 of a data transmission apparatus of an embodiment of the present invention is illustrated. Portion or apparatus 8 includes a controller 10, a modulator 20, a carrier controller 30, a receiving filter 40, a demodulator 50, a carrier detector 60, and a circuit switching switch 70.

Controller 10 is coupled to read an output signal from the carrier detector 60 via a signal line 14. It is also coupled to control switching in switch 70 through a control line 16. It is controllingly coupled via a line 15 to carrier controller 30, and is coupled via lines 12 and 13 respectively to demodulator 50 and modulator 20.

Modulator 20 is coupled to modulate a digital signal from the sending data signal line 13 and transmit it to a signal line 25 as an analog signal.

Carrier controller 30 is coupled to switch on and off the carrier signal from modulator 20 in response respectively to a "1" or "0" carrier control signal (in a digitized format) fed from controller 10 onto the carrier signal line 15.

Receiving filter 40 is to assist the error detector 60 by eliminating noise from the received signal.

Demodulator 50 is to demodulate the analog signal fed onto the receiving signal line 55 through the receiving filter 40 and deliver it as a digital signal on the received data signal line 12.

Carrier detector 60 detects a received signal level of the signal delivered on the receiving signal line 55 through the receiving filter 40 and transmits "1" if the received signal level is above a predetermined value and "0" if the same is below that value, onto the signal line 14.

Switch 70 is coupled to switch the connection of the circuit with the interior of the apparatus or the telephone set on the basis of the control signal from controller 10 and operate such that it connects 1' with 2' when 1 is connected with 2 while connecting 1' with 3' when 1 is connected with 3.

Referring to FIGS. 2 and 3, timing charts of an automatic recognition procedure in the data transmission apparatus are illustrated, responsively. In particular, FIG. 2 illustrates a sending signal and a received signal in the calling side data transmission apparatus while FIG. 3 illustrates like signals in the called side. Operation of the automatic recognition of the embodiment is as follows.

A situation will first be described where both the data transmission apparatus 8 on the calling and 8* on the called sides are provided with an error control function.

Assume that circuit 8 is the calling side. Once the circuit is connected as a result of the call from the calling side, the controller 10* on the called side issues a switching control signal onto the switching control line 16 at a time instant To. As a result, switch 70* is controlled to switch the connection from the telephone set to circuit 8*. After a predetermined time interval $t_o$, carrier control 30* is switched on (carrier control signal "1"). As a result, it generates a carrier of a frequency $f_a$ which is sent to the circuit 8* on the calling side as an answer tone. The controller 10 on the calling side after recognizing the carrier $f_a$ controls switch 70 to switch the connection from the telephone set to the interior of the apparatus. Thus, a connection is now established and the two sides will now determine whether error control is present.

The carrier signal $f_a$ sent through circuit 8 is, as a result of the aforementioned switching, inputted into carrier detector 60 via receiving signal line 55, receiving filter 40 and switch 70. Thus, FIG. 2 shows receipt of carrier $f_a$ at time T1. Carrier detector 60 issues a signal "1" indicative of the detection of the carrier frequency to controller 10 via line 14. When controller 10 continuously detects the carrier over a time interval t1, then it waits for a second time interval t2 and causes an intermittent transmission of carrier $f_o$. Thus, circuit 8 transmits a carrier of a frequency $f_o$ only for a time interval $t_{on}$ and stops the carrier transmission only for a time interval $t_{off}$, as shown in FIG. 2. Controller 10 on the calling side signals the called side in this way that the calling side has an error control function or capability. This intermittent transmission of the carrier is effected in the preferred embodiment by controlling the carrier controller 30 via carrier control signal line 15. Controller 10 repeats the operation N times to the maximum, and simultaneously starts to detect whether or not the carrier sent from the called side is an interrupted signal.

Correspondingly, controller 10* on the called side monitors a signal from its carrier detector 60* via its signal line 14*. FIG. 3 shows a burst of four carrier pulses on the "receiving signal" which corresponds to the burst of four pulses on the sending line in FIG. 2. Controller 10* on the called side detects whether or not there is any repetition of the carrier frequency $f_o$ of the calling circuit. If controller 10* detects a predetermined number of repetitions in the carrier frequency, this constitutes a recognition at the called side that the calling side has an error control function.

In response to such a recognition, the called side is designed preferably to communicate to the calling side that it too has an error control capability. It does this by interrupting its own transmitted carrier $f_a$. That is, controller 10* controls the carrier control 30* to cause intermittent transmissions of the carrier $f_a$. Thus, as shown in FIG. 3, carrier control 30 interrupts the transmission of the carrier $f_a$ for a time interval t4, which has continuously been transmitted until then, then transmits the carrier only for a time interval $t_{on}$, and further interrupts the carrier transmission only for a time interval $t_{off}$. Controller 10* by such interruptions indicates to the calling side that the called side includes an error control function or capability. When $f_a$ is first interrupted, the calling side has not yet determined whether the called side has error detection or not. Thus, the calling side transmits the fourth (illustratively) carrier pulse $f_o$ shown in FIGS. 2 and 3.

On the calling side, controller 10 receives a signal from carrier detector 60. From this, controller 10 will detect that the received carrier $f_a$ has been interrupted for a time interval t3, shown in FIG. 2. In response, controller 10 stops the intermittent transmission of carrier $f_o$ and monitors the received carrier $f_a$ to detect whether $f_a$ persists as continuous or interrupted. Here, the interrupt duration t4 of carrier $f_a$ is set to be longer than t3. Controller 10 recognizes that the carrier $f_a$ from the called side has been interrupted a certain number of times. It thereby recognizes that the called side also has error control. Controller 10 then controls the carrier controller 30 to continuously transmit the carrier $f_o$. Thus, in FIG. 2, controller 10 at the calling side sends interrupted carrier pulses until it receives an interruption of time t3 in the received carrier. After counting three, illustratively, subsequent carrier pulses $f_o$, it transmits a continuous carrier $f_o$. Meanwhile, the called side continues to send carrier pulses because it has not yet learned that the calling side has recognized the pulses which signify that error control is present at the called side.

Controller 10* (on the called side) now detects the continuous transmission of the carrier $f_o$ from the calling side for a time interval t5 (via the carrier detector 60*). Controller 10* then switches the transmission of carrier $f_a$ from an interrupted mode to a continuous mode, as the calling side is now recognizing that the remote (called) controller 10* also has the error control function. The called side completes the automatic recognition after interval t5, at a time instant T2.

Next, the calling side completes automatic recognition at a time instant T3 when its controller 10 detects the continuous carrier $f_a$ from the called side for a time interval t6 via the carrier detector 60.

The above description was for the circumstance where both the calling and called sides have error control. Thereupon, the carrier transmission time interval $t_{on}$ and the carrier transmission interruption time $t_{off}$ upon the intermittent transmission should be shorter than the time when a circuit not having error control recognizes that it detects the carrier and the time when it recognizes that the carrier disappears (specified on the basis of the Bell Standard and CCITT Standard), respectively. The reason is that with the remote side not having any error control, the controller recognizes the carrier for the first time interval $t_{on}$ and further recognizes that the carrier is interrupted for the next time interval $t_{off}$, thereby abandoning the circuit.

Additionally, for the intermittent recognition of a carrier, the interruption time should be severely monitored or provided with any hysteresis. This is because no detection of the interruption time is assured since in a mobile telephone line there is fading in the course of its traveling owing to multipath transmission, followed by disappearance of the carrier.

When the calling side has an error control function but the called side does not, the calling side sends an intermittent carrier signal $f_o$ interrupted N times to the maximum. Since the called side does not have error control, it does not recognize the interrupted carrier, and will not answer by interrupting its own carrier $f_a$. The absence of interruptions in the carrier $f_a$ when received and detected at the calling side causes the calling side controller to recognize that the called side has no error control function.

Finally, when the calling side has no error control function but the called side does have one, then the calling side does not interrupt its carrier $f_o$. The called side recognizes the calling side has no error control function, on the basis of direct detection of the carrier from the calling side beyond the specified time interval $t_{on}$.

According to the data transmission apparatus and method described above, when an error control function is resident in a circuit, that circuit will send an intermittent carrier signal prior to starting data transmission and recognize whether or not a remote data transmission apparatus also has an error control function by determining whether the carrier it receives back is continuous or interrupted. Accordingly, equipment including modulator/demodulator parts and the like are available for data transmissions with and/or without error control. Using a simple filter for carrier detection, this leads to high reliability recognition of whether an error control function is resident on a remote data transmission apparatus.

Although a certain preferred embodiment has been shown and described, it should be understood that many changes and modifications may be made therein without departing from the scope of the appended claims.

What is claimed is:

1. A data transmission apparatus for effecting both data transmissions each with error control and/or without the same comprising:
   (a) transmitter means for sending an intermittent carrier signal prior to data transmission, the carrier signal indicating that said apparatus possesses an error control function;
   (b) detector means for detecting whether or not a carrier signal sent from a remote transmission apparatus is intermittent; and
   (c) control means for controlling the transmission of said transmitter means while recognizing whether or not the remote data transmission apparatus has an error control function based upon whether or not the carrier signal detected by said detector means is intermittent.

2. A data transmission apparatus for effecting both data transmission each with error control and without the same, comprising:
   (a) transmitter means for sending prior to data transmission, an intermittent carrier signal switched on for a predetermined period of time or less, said intermittent carrier signal being indicative of a fact that said data transmission apparatus has an error control function;
   (b) detector means for detecting whether or not a carrier signal sent from a remote data transmission apparatus is an intermittent carrier signal switched on for a predetermined period of time or less; and
   (c) control means for controlling the transmission of said transmitter means while recognizing whether or not the remote data transmission apparatus has an error control function based upon whether or not the carrier signal detected by said detector means is an intermittent carrier signal on for a predetermined period of time or less.

3. A method for transmitting data between two communicating locations either or both of which may have an error control function comprising the steps of:
   sending an intermittent carrier signal prior to data transmission from one communicating location to another communicating location to indicate that the sending apparatus of said one communicating location includes an error control function;
   detecting by said one communicating location whether a carrier signal sent from said other communicating location is intermittent; and
   controlling subsequent transmission by said one communicating location based on the result of said detecting step.

4. The method of claim 3 wherein said one communicating location is a calling side and the other communicating location is a called side, and wherein if said calling side includes an error control function, then prior to data transmission sending an intermittent carrier from said calling side to indicate the presence of error control at the calling side;
   when the called side includes an error control, then recognizing receipt of said intermittent carrier at the called side and in response, sending an intermittent second carrier to the calling side, the calling side detecting the intermittent second carrier and thereafter sending a continuous carrier.

5. The method of claim 4 wherein if the called side lacks an error control, then transmitting an uninterrupted second carrier to the calling side, said calling side then detecting the uninterrupted second carrier.

6. An automatic recognition device for a data transmission apparatus capable of data transmissions with and/or without error control, said automatic recognition device capable of automatically recognizing whether or not a remote data transmission apparatus has an error control function, said device comprising:
   (a) carrier control means for sending to a communication line an intermittent carrier signal or a continuous carrier signal in accordance with a carrier control signal, wherein said intermittent carrier signal is a carrier signal turned on and off repeatedly in a predetermined pattern to indicate that said data transmission apparatus has the error control function, and wherein said continuous carrier signal is turned on longer than the time interval that said intermittent carrier signal is on;
   (b) detector means for receiving another intermittent carrier signal or another continuous carrier signal from the remote data transmission apparatus via a communication line and for issuing each corresponding signal in accordance with the presence or absence of the carrier signal; and (c) control means for providing said carrier control signal to said carrier control means and for determining whether or not the remote data transmission apparatus has an error control function in response to the signal received from the detector means.

7. A method for data transmission and for automatically recognizing the presence of an error control function, after a connection is established and prior to data transmission, between a data transmission apparatus with an error control function and a called data transmission apparatus with an error control function, said method comprising the steps of:
(a) sending from the called data transmission apparatus to said calling data transmission apparatus an answer tone indicating that said called data transmission apparatus is activated;
(b) detecting by said calling data transmission apparatus the answer tone received from said called data transmission apparatus for a predetermined time interval, and sending an intermittent carrier signal to said called data transmission apparatus indicating that said calling data transmission apparatus has the error control function;
(c) detecting by said called data transmission apparatus said intermittent carrier signal until a predetermined number of repetitions of interruption and thereafter interrupting the answer tone and recognizing that said calling data transmission apparatus has the error control function;
(d) detecting by said calling data transmission apparatus the interruption of said answer tone from said called data transmission apparatus and thereafter interrupting said intermittent carrier signal;
(e) sending by said called data transmission apparatus another intermittent carrier signal to said calling data transmission apparatus indicating that said called data transmission apparatus also has the error control function;
(f) detecting by said calling data transmission apparatus the other intermittent carrier signal from said called data transmission apparatus until a predetermined number of repetitions of interruption and thereafter sending a continuous responsive carrier signal to said called data transmission apparatus indicating that said calling data transmission apparatus received the other intermittent carrier signal and hereby recognizing that said called data transmission apparatus also has the error control function;
(g) detecting by said called data transmission apparatus the continuous responsive carrier signal for a predetermined time interval and sending another responsive carrier signal in response to the continuous responsive carrier signal from said calling data transmission apparatus, and hereby recognizing that said calling data transmission apparatus has recognized that said data transmission apparatus also has the error control function; and
(h) detecting by said calling data transmission apparatus the other responsive carrier signal from said called data transmission apparatus.

8. A method for data transmission and for automatically recognizing the presence and/or absence of an error control function, after a connection is established and prior to data transmission, between a calling data transmission with an error control function and a called data transmission without an error control function, said method comprising the steps of:
(a) sending by said called data transmission apparatus to said calling data transmission apparatus an answer tone indicating that said called data transmission apparatus is activated;
(b) detecting by said calling data transmission apparatus the answer tone sent from said called data transmission apparatus for a predetermined time interval, and sending an intermittent carrier signal to said called data transmission apparatus indicating that said calling data transmission apparatus has the error control function;
(c) sending continuously by said called data transmission apparatus, incapable of recognizing said intermittent carrier signal from said calling data transmission apparatus, a second answer tone indicating that said called data transmission apparatus has no error control function; and
(d) recognizing by said calling data transmission apparatus that said called data transmission apparatus does not have the error control function.

9. A method for data transmission and for automatically recognizing the presence and/or absence of an error control function, after a connection has been established and prior to data transmission, between a calling data transmission apparatus without an error control function and a called data transmission apparatus with an error control function, said method comprising the steps of:
(a) sending by said called data transmission apparatus to said calling data transmission apparatus an answer tone indicating that said called data transmission apparatus is activated;
(b) detecting by said calling data transmission apparatus the answer tone for a predetermined time interval, and sending a continuous carrier signal to said called data transmission apparatus; and
(c) detecting by said called data transmission apparatus that the continuous carrier signal from said calling data transmission apparatus continues beyond a predetermined time interval and recognizing that said calling data transmission apparatus has no error control function.

* * * * *